United States Patent [19]

Holt

[11] Patent Number: 4,570,117

[45] Date of Patent: Feb. 11, 1986

[54] MODULAR FIELD STRENGTH INSTRUMENT

[75] Inventor: Timothy L. Holt, Parma, Ohio

[73] Assignee: Bird Electronic Corporation, Solon, Ohio

[21] Appl. No.: 532,608

[22] Filed: Sep. 15, 1983

[51] Int. Cl.[4] ............................................. G01R 31/02
[52] U.S. Cl. ..................................... 324/72; 324/115; 324/133; 340/600; 343/703; 343/894; 455/67
[58] Field of Search ................... 324/72, 95, 133, 73 R, 324/115; 340/600; 343/703, 894; 455/67, 115, 226

[56] References Cited

U.S. PATENT DOCUMENTS

| | | | |
|---|---|---|---|
| 1,527,425 | 2/1925 | Miller | 324/73 R X |
| 1,764,410 | 6/1930 | Legg | 324/73 R X |
| 2,512,330 | 6/1950 | Hendrich | 324/115 X |
| 3,891,919 | 6/1975 | Penninger | 340/600 X |
| 3,927,375 | 12/1975 | Lanoe et al. | 343/894 |
| 4,080,566 | 3/1978 | Mecklenburg | 324/95 |
| 4,277,744 | 7/1981 | Audone et al. | 324/72 |
| 4,506,385 | 3/1985 | Fedde et al. | 455/67 X |

*Primary Examiner*—Stanley T. Krawczewicz
*Attorney, Agent, or Firm*—Pearne, Gordon, Sessions, McCoy, Granger & Tilberry

[57] ABSTRACT

A modular field strength measuring and indicating instrument that includes as one component a sensing module with a sensitive D'Arsonval meter movement and a receptacle for interchangeable plug-in type sensing modules for measuring an electrical condition, such as electrical power. The other component is a field strength sensing module that plugs into the receptacle and which includes a self-contained DC voltage source, a sensing antenna, a high-impedance, variable gain, linear DC amplifier operatively connected to the voltage source for amplifying the field strength voltage signal sensed by the antenna, and circuitry for transmitting the amplifier output voltage signal to the D'Arsonval meter movement for indicating the field strength detected by the instrument. The field strength sensing module may be used in the meter module interchangeable with other modules, such as modules for measuring RF power in RF transmission lines.

5 Claims, 5 Drawing Figures

MODULAR FIELD STRENGTH INSTRUMENT

BACKGROUND OF THE INVENTION

This invention relates to the measurement of electrical radiation from a transmitting source, particularly in the RF bands. More particularly, the invention relates to a modular instrument wherein a sensitive meter movement contained in an electrical power measuring and indicating device (such as an RF insertion-type watt-meter) is used in combination with a removable field strength sensing module to indicate the level of the electrical radiation detected by the instrument.

Instruments for indicating the strength or intensity of electrical radiation from a transmitting source, especially in the RF bands, are generally self-contained devices with a sensing antenna, an amplifier, and an indicating component such as an LED, an audible alarm, or a relatively low-sensitivity type meter movement. Typical devices of this type are shown in the following U.S. patents:

U.S. Pat. No. 3,636,641
U.S. Pat. No. 3,908,165
U.S. Pat. No. 4,072,899
U.S. Pat. No. 4,186,351
U.S. Pat. No. 4,199,716.

Because of the relative nature and therefore restricted usefulness of such an instrument, a high quality, high sensitivity meter movement is generally not used because of its cost. A high sensitivity meter movement in such an instrument would, however, be of decided value in certain applications owing to the increased overall sensitivity that it could provide.

Other electrical measuring instruments that do utilize high quality, high sensitivity type meter movements are usually used for different purposes, such as power measurement. One type of instrument widely used in the RF field is an insertion-type wattmeter for measuring the level of the forward and/or reflected wave on a coaxial transmission line. For example, an RF directional wattmeter currently available is manufactured and sold by Bird Electronic Corporation, of Solon, Ohio, under the trade designation "Model 43." This instrument is adapted to be connected in or inserted in an RF tranmission line, and has its own integral coaxial line section. The line section has an elongated, tubular, conductive metal body with a central, cylindrical opening and a coaxial center conductor positioned therein. The metal body also has a transverse opening communicating with the central cylindrical opening and adapted to receive an inductive pickup coil contained in an interchangeable module removably mounted for rotation in the opening, about an axis normal to the axis of the line section. The pick-up coil is responsive to the voltage wave signal on the transmission line. The pick-up coil transmits a voltage signal to a D'Arsonval meter movement so that the meter provides an indication of the level of either the forward voltage wave signal or the reflected voltage wave signal, depending upon the orientation of the inductive pick-up coil.

The device of the present invention affords a unique means for utilizing a high-cost, high-sensitivity type D'Arsonval meter movement adapted for use in power measurement. More specifically, the device is an interchangeable module for the purpose of measuring and indicating the relative value of an electrical field intensity at a given point, resulting from waves radiated from a transmitting source. Thus, the modular instrument of the present invention affords features and advantages heretofore not obtainable.

SUMMARY OF THE INVENTION

It is among the objects of the present invention to provide an improved electrical instrument for indicating the strength of radiated energy received from a transmitting source.

Another object of the invention is to enlarge the capability and utility of currently available RF insertion-type wattmeters adapted to measure the forward and/or reverse voltage wave levels on coaxial transmission lines.

These and other objects and advantages of the invention are achieved with the novel modular field strength meter of the invention, which comprises two separable components, including a first electrical component having a D'Arsonval meter movement and a receptacle adapted to receive interchangeable elements adapted to sense an electrical condition and to transmit a voltage signal through the receptacle to the meter movement for indicating the level of the condition sensed. The second component is a field strength sensing module adapted to be removably inserted in the receptacle. The field strength module includes a self-contained voltage source, an outwardly extending sensing antenna, a high impedance, variable gain, linear DC integrated circuit amplifier for amplifying an electromagnetic field strength level sensed by the antenna. The output of the amplifier is compatible with the D'Arsonval meter movement. The field strength module has contact means cooperable with contact elements in the receptacle for transmitting the amplified signal from the linear DC amplifier to the movement.

According to one form of the invention, the antenna is removable and interchangeable with differently configured antennas to expand the RF field strength sensing capability of the field strength module.

DESCRIPTION OF THE PREFERRED EMBODIMENT

Figure 1:
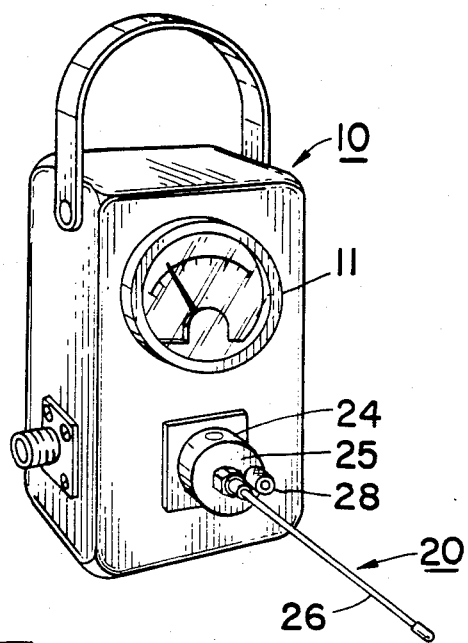
FIG. 1 is a perspective view of a modular RF field strength meter embodying the invention.
Figure 2:
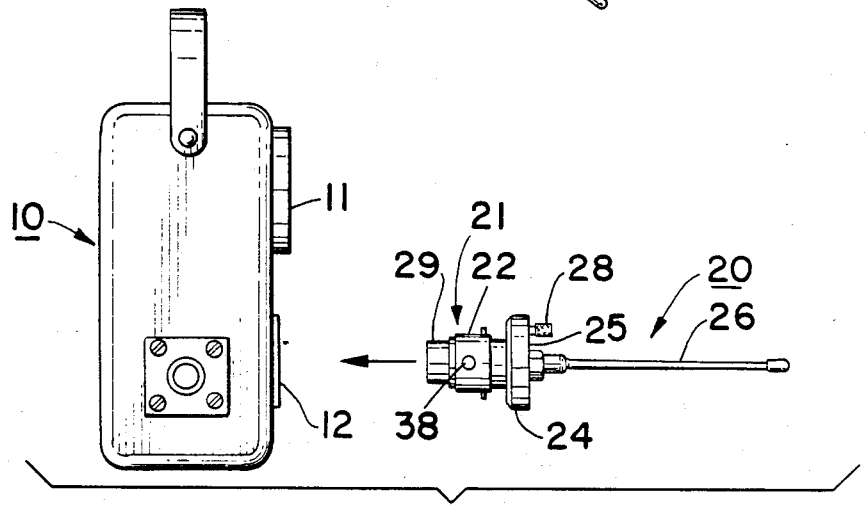
FIG. 2 is a side elevation of the modular instrument of FIG. 1, showing the field strength sensing module removed from the receptacle in the meter component.

Referring more particularly to the drawings, FIGS. 1 and 2 show a modular field strength meter embodying the invention, and including a basic meter module 10 and a field strength sensing module 20. The meter module 10 is essentially an insertion-type RF directional wattmeter, normally used for measuring and indicating the forward and/or reflected carrier wave power in coaxial transmission lines.

As indicated above, a wattmeter particularly adapted as a component of the instrument of the present invention is manufactured and sold by Bird Electronic Corporation, of Solon, Ohio, under the trade designation "Model 43 THRULINE wattmeter" and under other designations, including Model Nos. 4311, 4314, 4430, and others. These wattmeters include a coaxial line section adapted to be electrically inserted in a tubular transmission line, the line section having an elongated conductive metal body with a central cylindrical opening having a coaxial center conductor therein electrically insulated from the metal body. The metal body also has a transverse opening communicating with the central cylindrical opening and adapted to receive an inductive pick-up coil mounted for rotation in the opening about an axis normal to the axis of the line section. The pick-up coil is responsive to the voltage wave signal on the transmission line, and is adapted to transmit the signal through circuit means to a D'Arsonval meter movement 11 which provides an indication of the level of either the forward voltage wave signal or the reflected voltage wave signal, depending on the orientation of the inductive pick-up coil.

The pick-up coil is contained in an interchangeable plug-in element or coupler element of generally cylindrical form adapted to be inserted in a circular receptacle 12 in the face of the meter component 10.

In accordance with the invention, a unique field strength sensing module 20 is inserted in the receptacle 12, as shown in FIG. 1 and in the manner indicated by the arrow in FIG. 2, to essentially convert the function of the meter component 10 from a power measuring and indicating instrument to a field strength meter.

Figure 3:
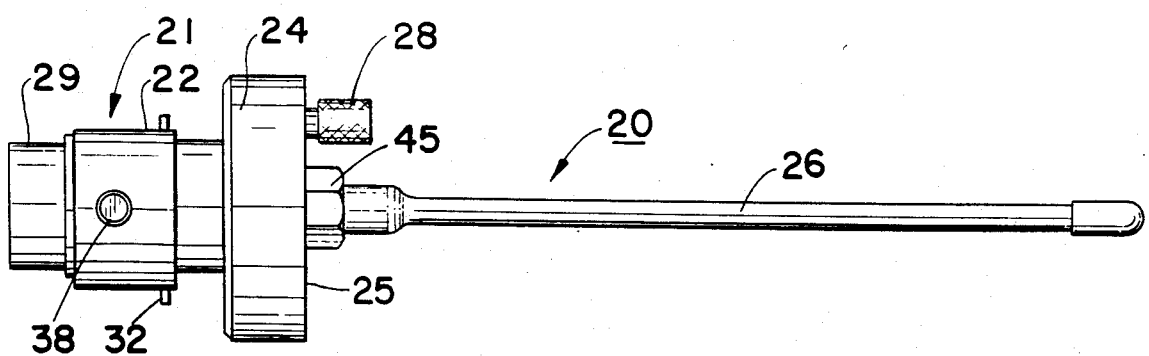
FIG. 3 is an elevational view, on an enlarged scale, of the field strength sensing module of the instrument of FIGS. 1 and 2.
Figure 4:
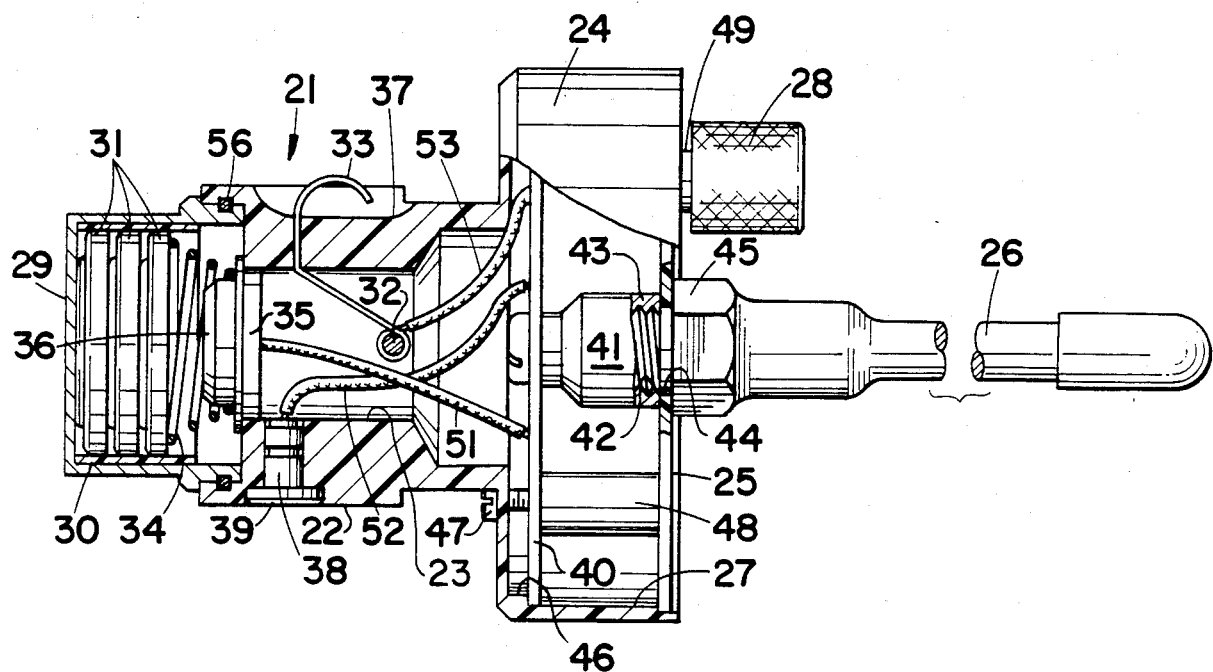
FIG. 4 is a longitudinal, sectional view on an enlarged scale of the field strength sensing module of FIG. 1.

The field strength component 20, best shown in FIGS. 3 and 4, comprises a tubular, cylindrical housing 21 formed of non-conductive material, such as a thermosetting plastic. The housing 21 has a tubular central portion 22 that defines an axial opening 23, and an enlarged cylindrical forward portion 24 that defines a recess 27. The recess 27 communicates with the opening 23 and is covered by a circular face plate 25. The central housing portion 22 is adapted to be received in the matching cylindrical receptacle 12 in the meter component 10.

Referring to FIG. 4, the central portion 22 has a relatively thin transverse bar 32 formed of a conductive metal extending laterally therethrough, the ends of which extend radially outward from opposite sides of the housing 21. A relatively stiff ground contact wire 33 extends through a radial opening in the central portion and has its inner end secured to the bar 32. The outer end of the contact 33 is curved into an arc and is located in a longitudinally extending slot 37 formed in the outer surface of the central portion 22. The wire 33 is adapted to make contact with a cooperating ground contact means in the receptacle 12. The inner end of the wire 33 is wrapped around the bar 32 to make a sound electrical contact therewith. The radially extending ends 33 of the bar 32 may be received in matching notches in the receptacle 12 for the purpose of accurately locating the element 20 in the receptable.

A contact pin 38 with an enlarged contact head 39 is located in a radial opening in the central housing portion 22 diametrically opposite from the outer end of the contact wire 33. The contact head 39 is adapted to make the necessary contact with a positive circuit element within the receptacle 12.

Figure 5:
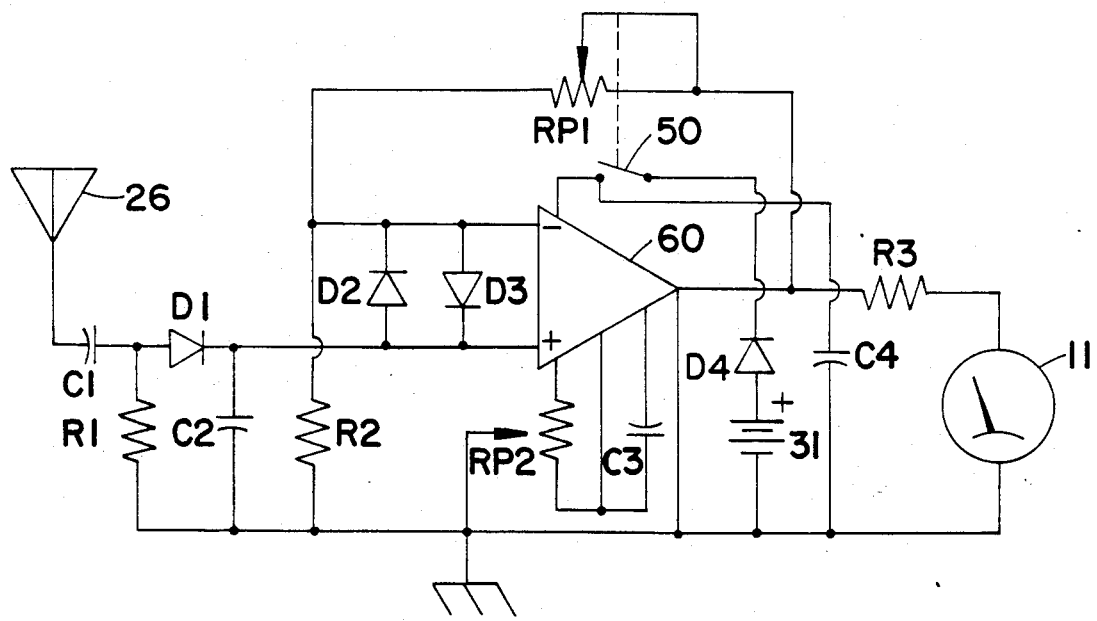
FIG. 5 is a schematic diagram of the modular field strength meter of the invention.

A sensing antenna 26 and rotary control knob 28 are positioned on and extend outwardly from the face plate 25. The knob 26 operates both an on/off switch 50 and a gain control RPI, both of which are shown in FIG. 5.

The rearwardly extending open end of the central housing portion 21 is closed by a cylindrical casing 29 that is locked in place by a snap ring 56. The snap ring 56 seats in an annular groove in the outer surface of the casing 29 and in a matching annular groove in the interior surface of the central housing portion 21.

An insulating sleeve 30 formed of non-conductive material is mounted in the casing 29 to define a chamber for three 3-volt camera-type lithium dry cells 31 positioned in mutually contacting series relationship, as best shown in FIG. 4. The rearward contact surface of the rearwardmost cell engages the interior metal surface of the casing 29, and the forward contact surface of the forwardmost cell engages a helical contact spring 34, which in turn engages a circular metal contact insert 35 mounted in the central opening 23 of the central housing portion 22. The insert 35 has a rearwardly extending, centering portion 36 that serves to locate and center the helical contact spring 34.

Mounted within the circular recess 27 defined by the enlarged forward housing portion 24 is a circular printed circuit board 40 that is spaced rearwardly from to the circular face plate 25. A central cylindrical antenna mount 41 is secured at the center of the circuit board 40 and has a threaded opening 42 that receives a threaded stud 43 at the base of the antenna 26. The threaded stud 43 extends through a central opening 44 in the face plate 25. The antenna 26 has a hexagonal base portion 45.

The printed circuit board 40 rests against an annular shoulder 46 in the recess 27 and is secured by means of screws 47 that extend in an axial direction through the rearwardly facing surface of the housing portion 24 and into threaded spacer sleeves 48 secured to the forward face of the printed circuit board 40.

Also mounted on the printed circuit board 40 are a gain control/switch body, with a shaft 49 that extends through a circular opening in the face plate 25 for connection to the control knob 28.

The contact insert 35 is connected to appropriate circuitry on the printed circuit board 40 by means of an electrical lead 51 and another lead 52 connects appropriate circuitry on the printed circuit board to the contact element 35.

A ground lead 53 connects the transverse bar 32 and the ground contact wire 33 to a ground contact on the printed circuit board 40.

Referring to FIG. 5, the relative value of the electrical field intensity sensed by the antenna 26 is transmitted by appropriate circuitry to a high-impedance, variable gain, linear DC amplifier 60 mounted on the printed circuit board 40, and the output of the amplifier 60 is transmitted from the printed circuit board 40 through the lead 52 to the contact pin 38 and from there through appropriate meter circuitry to the meter movement 11.

In the device shown, the meter movement 11 is a high-quality 30-microampere meter, and the output of the linear DC amplifier 60 is matched to the meter movement through proper selection of the integrated circuit components. In the present instance, the amplifier 60 is an RCA #CA 3130 integrated circuit amplifier.

The signal conditioning circuitry for the amplifier 60 adapted to transmit the relative field strength level sensed by the antenna 26 to the amplifier utilizes a resistor R1 to clamp the AC voltage present at the input above ground potential. A diode D1 serves as a detector and is selected to provide a high sensitivity and also a relatively high reverse breakdown voltage.

A capacitor C1 is connected between the diode D1 and the antenna 26. Another capacitor C2 is connected between the output end of the diode D1 and ground, to remove any AC component that may remain in the voltage signal. The resulting signal is applied to the input terminal of the linear DC amplifier 60 and a pair of reverse oriented clamping diodes D2 and D3 are used to protect the amplifier from an over-voltage. Other components include resistors R2 and R3, variable gain control resistor RP1, variable resistor RP2 which provides the "offset null" adjustment for the amplifier 60, capacitor C3 which is a "compensation" capacitor for the amplifier, capacitor C4, and diode D4.

The designation and/or values of the diodes, capacitors, and resistors shown and described above and in FIG. 5 are listed in the Table below.

TABLE

| Circuit Component | Type Number or Value |
|---|---|
| D1 | HP 2800 |
| D2 | IN 4148 |
| D3 | IN 4148 |
| D4 | IN 4148 |
| C1 | .01 uf |
| C2 | .001 uf |
| C3 | 100 pf |
| C4 | .01 uf |
| R1 | 10K ohms |
| R2 | 51 ohms |
| R3 | 200K ohms |
| RP1 | 5K ohms |
| RP2 | 100K ohms |

In the operation of the device, the electrical field intensity present at the antenna induces a voltage that is capacitively coupled to the two-diode arrangement (D2 and D3) and the resulting DC voltage signal is applied to the input of the linear DC amplifier 60. The output of the amplifier is then transmitted through the RF sensing module circuitry to the meter component circuitry and is then applied to the D'Arsonval meter movement 11. The relative electric field intensity is read on the meter by the relative deflection of the meter needle.

The circuitry of the field strength sensing module 20 has been selected in the embodiment shown for a very broad RF wave band. However, according to one aspect of the invention, several different field strength modules may be used and associated with the meter component 10 to provide a field strength level measuring and indicating capability over different specific RF frequency bands.

The principal advantage of the present invention is that a currently available electrical instrument adapted for a particular use other than field strength measurements may be used with a field strength module 20 of the type described to enlarge its capability to include field strength measurement, thus further enhancing the utility of the relatively expensive and highly sensitive D'Arsonval meter movement contained in the meter component.

It is also expected that the module 20 may be used with other types of signal processing and display systems than a D'Arsonval meter movement. A microprocessor type device with a digital read out would be another suitable system.

While the invention has been shown and described with respect to a specific embodiment thereof, this is intended for the purpose of illustration rather than limitation, and other variations and modifications of the specific device herein shown and described will be apparent to those skilled in the art, all within the intended spirit and scope of the invention. Accordingly, the patent is not to be limited in scope and effect to the specific embodiment herein shown and described, nor in any way that is inconsistent with the extent to which the progress in the art has been advanced by the invention.

What is claimed is:

1. In combination:
an electrical measuring device including a meter movement, said device having a receptacle with mating contacts for a removable component adapted to transmit a voltage signal through said contacts to said meter movement, and
a field strength sensing module adapted to be removably inserted in said receptacle, said module comprising:
a self-contained DC voltage source;
an antenna;
a linear DC amplifier powered by said DC voltage source for amplifying a field strength level sensed by said antenna, said amplifier having a voltage output signal compatible with said meter movement;
circuit means for conditioning and transmitting to said amplifier the field strength signal sensed by said antenna; and
contact means cooperable with said receptacle contacts for transmitting the amplified signal from said linear DC amplifier to said meter movement.

2. A combination as defined in claim 1, wherein said electronic measuring device comprises an RF insertion-type wattmeter.

3. A combination as defined in either of claims 1 and 2, wherein said amplifier is a high-impedance, variable gain, linear DC amplifier.

4. A field strength sensing module adapted to be removably connected through a receptacle with mating contacts to an electrical instrument component that includes a D-Arsonval meter movement, said module comprising:
a DC voltage source;
an antenna;
a linear DC amplifier powered by said DC voltage source for amplifying an RF field strength level sensed by said antenna, said amplifier having a voltage output signal compatible with said meter movement;
circuit means for conditioning and transmitting to said amplifier the field strength signal sensed by said antenna; and
contact means cooperable with said receptacle contact for transmitting the amplified signal from said linear DC amplifier to said meter movement.

5. A field strength sensing device adapted to be operatively connected through a receptacle with mating contacts to an electrical instrument that inlcudes a signal processing and display means, said device comprising:
a DC voltage source;
an antenna;
a linear DC amplifier powered by said DC voltage source for amplifying an RF field strength level sensed by said antenna, said amplifier having a voltage output signal compatible with said meter movement;
circuit means for conditioning and transmitting to said amplifier the field strength signal sensed by said antenna; and
contact means cooperable with said receptacle contacts for transmitting the amplified signal from said linear DC amplifier to said signal processing and display means.

* * * * *